United States Patent

Athanas

[15] 3,673,428

[45] June 27, 1972

[54] INPUT TRANSIENT PROTECTION FOR COMPLEMENTARY INSULATED GATE FIELD EFFECT TRANSISTOR INTEGRATED CIRCUIT DEVICE

[72] Inventor: Terry George Athanas, Lebanon, N.J.

[73] Assignee: RCA Corporation

[22] Filed: Sept. 18, 1970

[21] Appl. No.: 73,343

[52] U.S. Cl. ............................307/202, 307/304, 317/235 B, 317/235 E, 317/235 G, 317/235 T, 317/235 AM

[51] Int. Cl. ..........................................................H01l 19/00

[58] Field of Search ................317/235 B, 235 G, 235 E, 235

[56] References Cited

UNITED STATES PATENTS

| | | | |
|---|---|---|---|
| 3,440,503 | 4/1909 | Gallagher et al. | 317/235 |

FOREIGN PATENTS OR APPLICATIONS

| | | | |
|---|---|---|---|
| 6,802,684 | 8/1968 | Netherlands | 317/235 |
| 6,802,685 | 8/1968 | Netherlands | 317/235 |

*Primary Examiner*—John W. Huckert
*Assistant Examiner*—William D. Larkins
*Attorney*—Glenn H. Bruestle

[57] ABSTRACT

In a CMOS integrated circuit of the type which includes a diffused P type region in which the N type transistors are formed, a resistor-region is provided by diffusion at the same time as that P type region. A diode having low breakdown is established by forming P+ type regions or N+ type regions in electrical communication with the resistor so that the diode breakdown is effectively dominated by the impurity concentration characteristics of the P+ type or N+ type regions.

9 Claims, 5 Drawing Figures

INVENTOR.
TERRY GEORGE ATHANAS
BY
Robert B. William
Attorney

INPUT TRANSIENT PROTECTION FOR COMPLEMENTARY INSULATED GATE FIELD EFFECT TRANSISTOR INTEGRATED CIRCUIT DEVICE

BACKGROUND OF THE INVENTION

This invention relates to insulated gate field effect transistors and particularly to integrated circuits employing insulated gate field effect transistors.

One kind of an insulated gate field effect transistor includes a semiconductive substrate having a planar surface and spaced source and drain regions in the substrate adjacent to the surface to define and make contact to a conduction path called a channel. A layer of insulating material, which is usually thermally grown silicon dioxide, is disposed on the surface over the channel, and a gate electrode is disposed on the insulating layer in electric field applying relation to the channel. Silicon dioxide has a breakdown strength of about $10^7$ volts/cm and consequently any transient voltage of about 10 volts per 100 A of oxide on the gate electrode will probably cause breakdown of the insulator and short circuit the gate to the substrate. Voltages of this magnitude are difficult to avoid during manufacture, testing, assembly, or other handling of the devices. Voltages much higher are often produced by simple electrostatic charge accumulation on the human body.

Gate insulators in integrated circuit devices which contain insulated gate field effect transistors are likewise subject to disruption due to high voltage transients, and protective circuits to guard against this damage have been included in these devices. One such integrated circuit device is the so-called CMOS integrated circuit which employs enhancement type transistors having channels of both N and P type conductivity. Usually, the transistors are made in an N type wafer containing a diffused P type region called the P well. N type transistors are formed within the P well and P type transistors are formed outside the P well. Other diffused regions are also included in conventional devices. For example, P+ diffusions are employed for conductive tunnels and for leakage-preventing guard bands.

A known input protection circuit for CMOS integrated circuits includes (1) a current limiting resistor between the input terminal and the gates to be protected, (2) a first diode having its anode connected to the gates to be protected and its cathode connected to a source of the highest potential in the circuit, and (3) a second diode having its anode connected to a source of the lowest potential in the circuit and its cathode connected to the gates to be protected. Heretofore, this circuit has been realized by forming a P+ type diffusion for the current limiting resistor. This diffusion has been carried out at the same time as the diffusions for tunnels and guard bands, in accordance with the general practice in the semiconductor art to form all similar regions at the same time. The resistor can be made long enough to establish a resistance of typically about 500 ohms. Concurrently, one diode function is provided by the PN junction between the resistor region and the N type substrate. The concentration gradient in the P+ region and the background doping of the N type substrate have resulted in a breakdown voltage of about 50 volts. The other diode function has been provided by a PN junction between an N+ diffusion and the P well with a typical breakdown voltage of about 25 volts.

This construction has been used successfully but the relatively low sheet resistivity of the P+ resistor diffusion has required the use of substantial chip area, because the resistor must be quite long in order to provide sufficient resistance. Attempts to increase the sheet resistivity of the P+ diffusion so that the resistor could be shorter have resulted in decreased production yields due to failure of the protective function of the simultaneously formed P+ guard bands.

SUMMARY OF THE INVENTION

The present novel construction for resistor and diode devices useful in the protection of the insulators of insulated gate field effect transistors includes a resistor region the impurity concentration gradient of which is such that it forms a gradual PN junction of relatively high breakdown strength in the semiconductor body. A diffused diode region, defining an abrupt PN junction with relatively low breakdown strength, is coupled to the resistor region.

THE DRAWINGS

DETAILED DESCRIPTION

Figure 1:
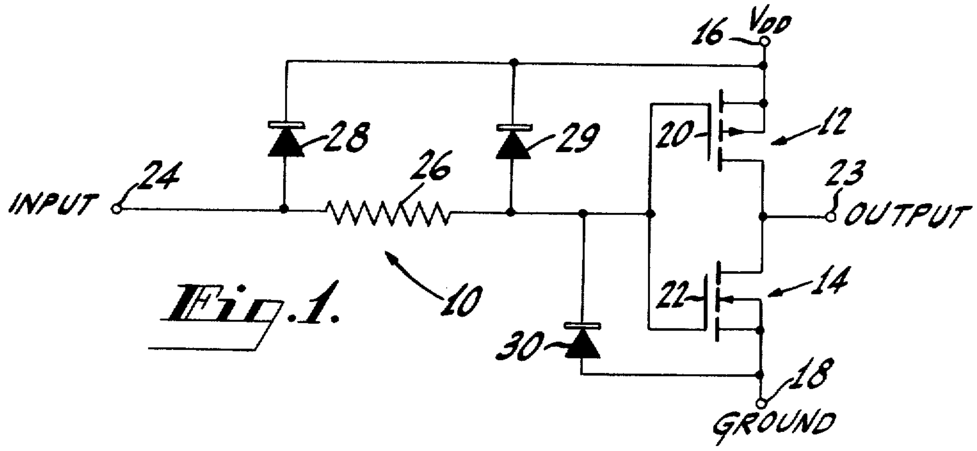
FIG. 1 is a schematic representation of a CMOS integrated circuit including a gate oxide protection circuit.

FIG. 1 shows a circuit 10 which represents both the prior gate oxide protection structure described above and the present novel gate oxide protection structure. The CMOS circuit to be protected is a represented in FIG. 1 by a simple complementary pair inverter including a P type insulated gate field effect transistor 12 and an N type insulated gate field effect transistor 14 connected in series between a supply terminal 16 labeled $V_{DD}$ and a ground terminal 18. The transistors 12 and 14 have insulated gate electrodes 20 and 22 which are connected together so that each receives the same input signal. The respective drains of the transistors 12 and 14 are connected to an output terminal 23.

The circuit elements which provide protection for the gate insulators of the transistors 12 and 14 are connected between an input terminal 24, the gates 20 and 22, and the terminals 16 and 18 as follows. First, there is a resistor 26 which is connected between the input terminal 24 and the gates 20 and 22. From the resistor 26 to the $V_{DD}$ terminal 16, there are diodes 28 and 29 which have their anodes connected at the ends of the resistor 26 and their cathodes connected together and to the terminal 16. In the construction according to the prior art, as explained above, there is a distributed or continuous diode defined by the resistor region itself. Otherwise, the circuit of FIG. 1 is an accurate representation of the prior structure.

A diode 30 is connected between the terminal 18 and the gates 20 and 22 to be protected. The diode 30 has its anode connected to the terminal 18 and its cathode connected to the gates 20 and 22.

The operation of the circuit 10 is as follows. Before the device is connected to power supplies and utilization circuits, the various terminals may have extremely high voltage pulses applied thereto, such as for example, pulses resulting from electrostatic charge accumulation on a human body. These voltages may appear between any of the terminals 16, 18, 23 and 24. If, for example, the input terminal 24 becomes highly positive with respect to the $V_{DD}$ terminal 16, the diodes 28 and 29 will be forward biased and the maximum voltage which can exist across the oxide of the transistor 12 will be equal to the forward voltage drop across the diodes 28 and 29, about 1 volt. If the input terminal 24 is highly positive with respect to the ground terminal 18, the diode 30 will be reverse biased but because it has a relatively low reverse breakdown voltage (about 25 volts), the maximum voltage across the oxide of the transistor 14 will be about 25 volts.

If a high positive voltage pulse is applied on the input terminal 24 relative to and the output terminal 23, the path for the current resulting from the applied voltage will be from the input terminal 24 through the resistor 26, the diode 30, and then through the substrate-to-source or substrate-to-drain diode of the transistor 14 to the output terminal 23. Current will not flow through the transistor 12 because this transistor is "off" under these conditions and its substrate-to-source or substrate-to-drain diodes will be reverse biased with a breakdown voltage of about 50 volts, i.e., about twice the breakdown voltage of the diode 30. Under these conditions then, the maximum voltage which can occur across the oxides of both transistors 12 and 14 is equal to the sum of the breakdown voltage of the diode 30, and the forward voltage drop of the substrate-to-source or substrate-to-drain diode transistor 14, or about 26 volts.

Similar considerations can be developed where the other terminals 16, 18 and 23 receive the high voltage pulse. For example, if the high positive voltage is impressed on the $V_{DD}$ terminal 16 relative to the input terminal 24, there will be a current path through the P type transistor 12, which will be "on" because of the relatively low voltage on its gate, then through the drain-to-substrate diode of the N type transistor 14 and then through the diode 30 and the resistor 26 to the input terminal 24. The maximum voltage across the oxide of the P type transistor 12 will be equal to the sum of the voltage drop through that unit (about 4 volts), the reverse breakdown voltage of the drain-to-substrate diode of the transistor 14 (about 25 volts) and the forward voltage drop of the diode 30 (about 1 volt), or about 30 volts. The circuit 10 limits the voltage across the gate insulators of the transistors 12 and 14 to a maximum of about 30 volts, regardless of where the high voltage transient is applied. This is well below the breakdown voltage of the gate insulators.

Figure 2:
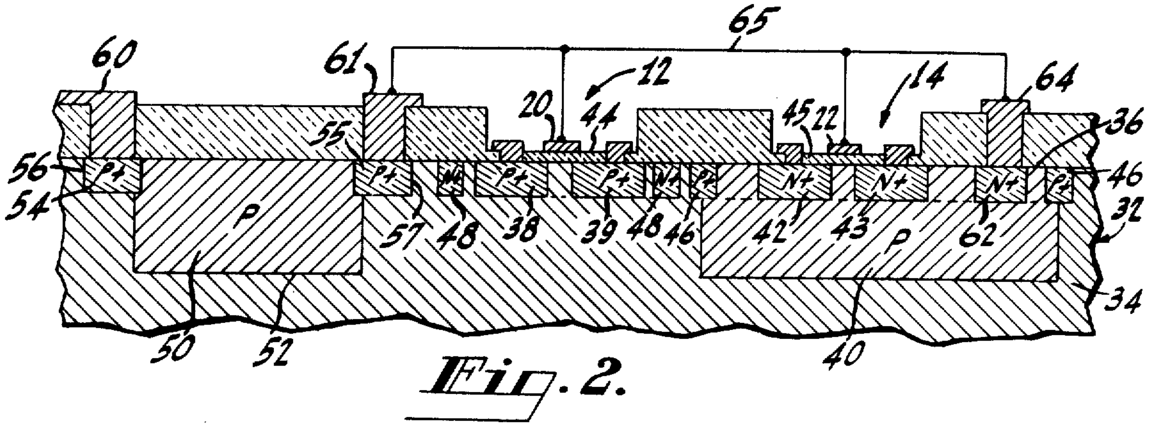
FIG. 2 is a cross sectional view showing one embodiment of the present construction of a gate oxide protection circuit.
Figure 3:
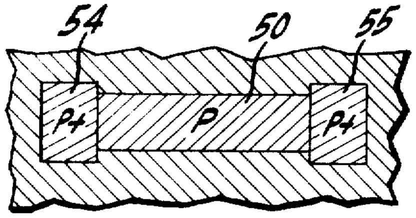
FIG. 3 is a partial plan view showing the configuration of a portion of the structure of FIG. 2.

FIGS. 2 and 3 illustrate the present novel construction of an integrated circuit device 32 which incorporates the circuit 10. The device 32 includes a body of semiconductive material such as silicon which, in this example, is of N type conductivity having a resistivity between about 0.1 and about 10 ohm cm. The body 34 has a surface 36 adjacent to which the regions which define the active and passive circuit elements are formed.

The transistor 12 has spaced source and drain regions 38 and 39 of P+ type conductivity formed adjacent to the surface 36 by diffusion of acceptor impurities in known fashion. For example, these regions may be formed by masking the surface 36 and then exposing the body 34 to a source of P type conductivity modifiers such as boron (e.g., a boron nitride source), at a temperature between about 1,000° C and about 1,100° C, for a period of about 30 minutes. This results in a relatively shallow P+ type diffusion of about 30 ohms per square, with a steep concentration gradient and consequently an abrupt PN junction of relatively low breakdown voltage, i.e., about 50 volts.

To provide a substrate for the N type transistor 14 there is a P type region 40, called a P well, which has a greater depth of diffusion and a more gradual impurity concentration gradient then the P+ type regions 38 and 39. The P well 40 may be formed, for example, by appropriately masking the surface 36 and then exposing the device, at a temperature of from about 800° to about 820° C, to a source of P type conductivity modifiers. Boron, derived from boron nitride, is again acceptable. The result of this step is the formation of a shallow diffused region in the body 34 adjacent to the surface 36. The boron impurities are then redistributed in the body 34 by heating the body to a temperature of about 1,200° C for a period of a few minutes to about 6 hours in a dry oxygen ambient. Preferably, an outdiffusion step is next performed, to reduce the surface concentration of impurities in the P well 40. To accomplish this, the body 34 is heated in water vapor or steam at a temperature of about 1,100° C for about 30 minutes to about 6 hours. The end result of this processing is to produce in the P well 40 a relatively low impurity concentration gradient and a relatively gradual PN junction with the N type material of the body 34. Within the P well 40, the transistor 14 has N+ type source and drain regions 42 and 43, respectively, which are formed in conventional manner by the diffusion of phosphorus.

The gate electrodes 20 and 22 of the transistors 12 and 14 overlie the spaces between the respective source and drain regions and are separated therefrom by thin gate insulators 44 and 45 which are formed, for example, by oxidizing the surface of the body 34.

Also shown in FIG. 2 are a P+ type guard ring region 46 which surrounds the transistor 14 and an N+ type guard ring region 48 which surrounds the transistor 12. Other regions, not shown, may include P+ type or N+ type regions which function as resistors, tunnels or the like.

In the present novel construction, the function of the resistor 26 is provided by a diffused region 50 of P type conductivity in which the depth of diffusion and the impurity concentration gradient is such as to provide a relatively gradual PN junction 52 between the region 50 and the surrounding material of the body 34. The sheet resistivity in the region 50 may be quite high e.g., around 750 ohms per square, so that the resistor need not be very long in order to provide substantial resistance. To establish these conditions, the region 50 may be diffused at the same time as the P well 40, in accordance with the processing sequence described above.

A boundary portion of the region 50 intercepts the surface 36 of the body 34 and, in overlapping relation to this boundary portion, there are a pair to P+ type regions 54 and 55 (FIG. 3). These regions are thus electrically coupled to the resistor region 50. They serve as anode regions for the diodes 28 and 29 since they define PN junctions 56 and 57 respectively with the material of the body 34. The N type material of the body 34 itself constitutes a common cathode region for the diodes 28 and 29. This material is conventionally electrically coupled to the $V_{DD}$ terminal 16 of the circuit 10. The regions 54 and 55 may be diffused at the same time as the source and drain regions 38 and 39 of the transistor 12, for example. As mentioned above, the impurity concentration gradient in these regions is steep, such that the junctions 56 and 57 also are abrupt and have a breakdown voltage of about 50 volts.

Contact to the resistor region 50 is preferably made through the regions 54 and 55 because good ohmic contact can be made in these regions. Thus, metallic conductors 60 and 61 may be applied to these regions in known manner and may extend to the elements between which the resistor region 50 is desired to be connected.

The diode function of the diode 30 of FIG. 1 is provided by a diffused cathode region 62 of N+ type conductivity adjacent to the surface 36 within the P well 40, which latter region serves as an anode region. A metallic contact 64 serves to connect the region 62 to the metallic contact 61 by means of a lead schematically represented at 65.

Figure 4:
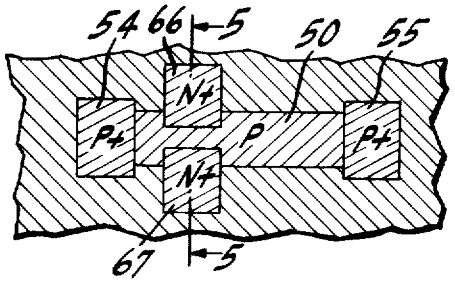
FIG. 4 is a plan view similar to FIG. 3 showing an alternative embodiment of the same portion of the structure of FIG. 2.
Figure 5:
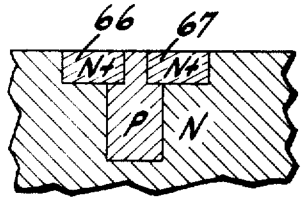
FIG. 5 is a cross section taken on the line 5—5 of FIG. 4.

FIGS. 4 and 5 illustrate an alternative embodiment of the present novel device. In this embodiment, a pair of N+ type regions 66 and 67 are formed in overlapping relation to the sides of the boundary of the region 50, as shown. These N+ type regions reduce the breakdown voltage of the diodes across the transistor 12 because this breakdown will be dominated by the N+ to P breakdown between the region 50 and the regions 66 and 67. The N+ type regions 66 and 67 and the region 62 are preferably formed simultaneously by diffusion of phosphorus from a phosphorus oxychloride source, for example. The body 34 is heated at a temperature of about 1,050° C in a phosphorus containing atmosphere for about 2 minutes and then for about 3 minutes in a phosphorus-free atmosphere. This results in regions of N+ type conductivity, with a sheet resistance of about 10 ohms per square, and in PN junctions with a breakdown voltage of about 25 volts.

The regions 54 and 55 may be omitted in this embodiment if adequate ohmic contact can be made otherwise to the region 50. The regions 66 and 67 should be placed close to the input side of the resistor region 50 as shown so that the voltage applied thereto is not materially diminished by the voltage drop through the resistor region 50. The spacing between the regions 66 and 67 may also be used to control the effective resistance of the region 50. The forward characteristic of the diode formed in this manner is sharp, resulting in fast operation.

When the device is constructed as described herein, substantial advantages are available in comparison to the prior art. First, the resistivity of the P+ regions can be made quite low since reliance on a diffusion like these regions is not required for the resistor region 50. Thus, the effectiveness of the P+ type guard bands, the resistance of P+ type tunnels and the source and drain resistances of all P type transistors in the circuit can be optimized. Contact resistances to the P+ type regions are low. The total area occupied by the gate protection elements is much less than that required in the prior construction leading to substantial savings in the cost of fabrication of these circuits. Another advantage is the relatively high resistance (1,000 ohms and higher) which is available from the higher resistivity in the P type resistor region 50.

What is claimed is:

1. In a semiconductor device of the type which has a body of semiconductive material of one type and degree of conductivity and which further has a plurality of diffused regions in said body adjacent to a surface thereof for defining active and passive circuit elements including a pair of insulated gate field effect transistors, one of which has spaced source and drain regions in said body adjacent to said surface and the other having a diffused well region of conductivity type opposite to that of said body in said body adjacent to said surface and a pair of source and drain regions of said one type conductivity within said well region, resistor and diode elements characterized by relatively high resistance and relatively low diode breakdown strength, respectively, comprising:

a diffused resistor region, of said opposite type conductivity and having the same depth and impurity concentration gradient as said diffused well region, in said body adjacent to said surface and defining a gradual PN junction in said body, whereby the breakdown strength of said PN junction is relatively high, said junction having a boundary which intercepts said surface, at least one diffused diode region, of said opposite type conductivity, in said body adjacent to said surface in overlapping relation to a portion of said boundary of said gradual PN junction and itself defining an abrupt PN junction of relatively low breakdown strength with the material of said body, and spaced conductors coupled to said resistor region for connecting said resistor to other elements of said device.

2. A semiconductor device as defined in claim 1 wherein said resistor region has the plan configuration of an elongated rectangle having a pair of relatively long sides and a pair of relatively short ends, said diode region being located at one of said ends.

3. A semiconductor device as defined in claim 2, further comprising:

a second diode region located at the other of said resistor ends.

4. A semiconductor device as defined in claim 2, further comprising:

a diffused region of the same type conductivity as said body in said body adjacent to said surface in overlapping relation to a portion of a side of said resistor region.

5. A semiconductor device as defined in claim 1 wherein one of said spaced conductors includes a metal electrode in contact with said diode region.

6. A semiconductor device as defined in claim 1 wherein there are at least two diffused diode regions each in overlapping relation to a different portion of said boundary of said gradual PN junction, and wherein said spaced conductors include metal electrodes in contact with both said diode regions.

7. A CMOS integrated circuit device comprising:

a body of semiconductive material of one type conductivity having a surface, a diffused well region of predetermined resistivity, and conductivity type opposite to that of said body, in said body adjacent to said surface, spaced source and drain regions of said one type conductivity within said diffused region adjacent to said surface, spaced source and drain regions of said opposite type conductivity outside of said diffused region adjacent to said surface, a gate electrode over the spaced between each pair of source and drain regions and separated therefrom by an insulator, and a resistor region of said opposite type conductivity in said body adjacent to said surface, said resistor region having the same resistivity and impurity concentration gradient as said well region.

8. A CMOS integrated circuit device as defined in claim 7 wherein said device has input terminals and said resistor region has spaced contacts thereto, one of said contacts being coupled to one of said input terminals and the other of said contacts being connected to a gate electrode.

9. A CMOS integrated circuit device as defined in claim 8 further comprising:

a diffused region of said opposite type conductivity in said body adjacent to said surface having a resistivity such that an abrupt, low breakdown PN junction is defined, and means coupling said region to said resistor region.

* * * * *